United States Patent
Magallanes et al.

(10) Patent No.: US 10,292,313 B2
(45) Date of Patent: May 14, 2019

(54) RACKMOUNT COOLING SYSTEM

(71) Applicants: DENSO AIRCOOL CORPORATION, Azumino-shi, Nagano (JP); TechniCool Innovations, Inc., Westminster, CO (US)

(72) Inventors: James Magallanes, Broomfield, CO (US); Yukio Ozawa, Torrance, CA (US)

(73) Assignees: DENSO AIRCOOL CORPORATION, Azumino-Shi, Nagano-Pref. (JP); TechniCool Innovations, Inc., Westminster, CO (US)

( * ) Notice: Subject to any disclaimer, the term of this patent is extended or adjusted under 35 U.S.C. 154(b) by 0 days.

(21) Appl. No.: 15/465,193

(22) Filed: Mar. 21, 2017

(65) Prior Publication Data

US 2017/0280593 A1     Sep. 28, 2017

Related U.S. Application Data

(60) Provisional application No. 62/312,942, filed on Mar. 24, 2016.

(51) Int. Cl.
*H05K 7/20* (2006.01)

(52) U.S. Cl.
CPC ..... *H05K 7/20818* (2013.01); *H05K 7/20736* (2013.01); *H05K 7/20754* (2013.01); *H05K 7/20609* (2013.01); *H05K 7/20681* (2013.01)

(58) Field of Classification Search
CPC .......... H05K 7/20663–7/2069; H05K 7/208–7/20827

USPC ........................ 361/679.46–679.54, 688–723
See application file for complete search history.

(56) References Cited

U.S. PATENT DOCUMENTS

| | | | | |
|---|---|---|---|---|
| 6,652,373 | B2 * | 11/2003 | Sharp ................. | H05K 7/20754 165/122 |
| 7,861,543 | B2 * | 1/2011 | Carlsen ................ | F24F 11/0015 165/231 |
| 8,422,223 | B2 * | 4/2013 | Su ....................... | H05K 7/20754 361/688 |
| 8,701,429 | B2 | 4/2014 | Oki | |
| 2009/0310300 | A1 * | 12/2009 | Chrysler ............ | H05K 7/20681 361/691 |
| 2017/0042067 | A1 * | 2/2017 | Parizeau ................... | G06F 1/16 |
| 2017/0064875 | A1 * | 3/2017 | Casey ................ | H05K 7/20736 |
| 2017/0325354 | A1 * | 11/2017 | Lee .......................... | H05K 7/18 |

FOREIGN PATENT DOCUMENTS

JP      2010061446 A     3/2010

* cited by examiner

*Primary Examiner* — Zachary Pape
(74) *Attorney, Agent, or Firm* — Harness, Dickey & Pierce, P.L.C.

(57) ABSTRACT

A cooling system for electronic equipment including an evaporator, a rack to which the electronic equipment can be mounted above the evaporator, and a condenser spaced apart from the evaporator. Air warmed by the electronic equipment is directed to the evaporator, cooled at the evaporator, and directed back to the electronic equipment to cool the electronic equipment.

13 Claims, 7 Drawing Sheets

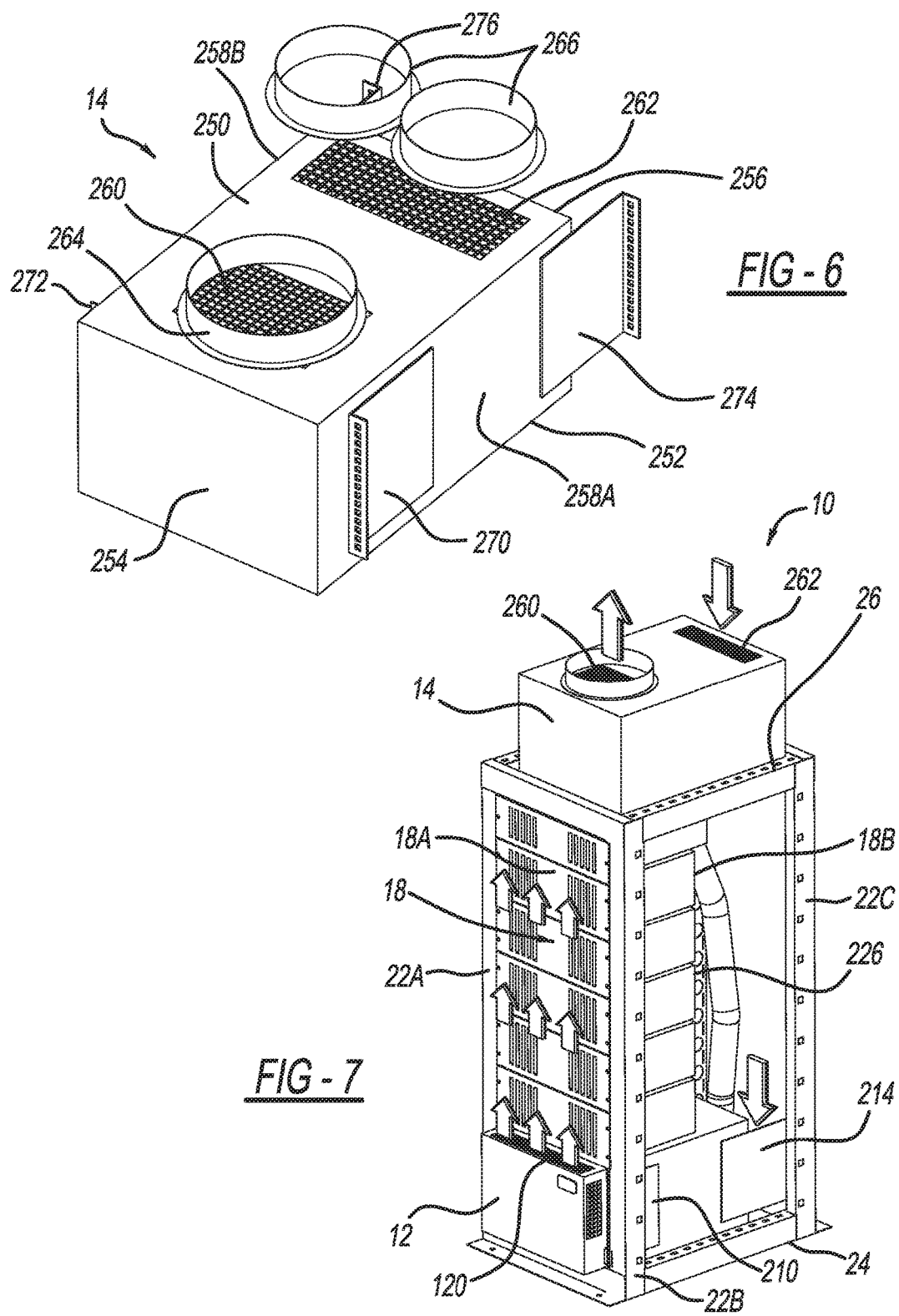

RACKMOUNT COOLING SYSTEM

CROSS-REFERENCE TO RELATED APPLICATION

This application claims the benefit of U.S. Provisional Application No. 62/312,942 filed Mar. 24, 2016, the entire disclosure of which is incorporated herein by reference.

FIELD

The present disclosure relates to a rackmount cooling system, such as for cooling electronic equipment mounted to a rack.

BACKGROUND

This section provides background information related to the present disclosure, which is not necessarily prior art.

A rack server, also called a rack mounted server, is a computer designed to be installed in a framework called a server rack. The rack contains multiple mounting slots called bays, each designed to hold heat producing electronic equipment, such as computer hardware (rack servers and other similar hardware systems, for example), telecommunications equipment, power equipment (protection, conditioner, transformers), industrial automation equipment, etc. The electronic equipment is secured in place with screws, rails, or other similar securing systems. The securing systems permit the electronic equipment to be quickly inserted and removed from the server rack. For example, rack servers and other similar hardware systems that are placed within the server rack are designed in a standardized manner, such that hardware provided from one company can be mounted in the same space as hardware from another company. Rack sizes are allocated as "rack units" or "U" units. Computing hardware is designed in multiples of this unit, such as 1 U, 2 U, 4 U, 8 U, or other similar multiples of the rack unit for installation in the server racks.

To cool the servers and other electronic equipment in the racks, internal cooling mechanisms, such as fans, integrated within most equipment draw cold air from the front side of the equipment and exhaust hot air out the back side of the equipment. To supply the cold air, data centers and companies employing server racks, for example, may maintain air conditioners that supply the server rooms with cold air to cool the computing components. However, these air conditioning systems typically cool inefficiently due to various factors (such as room layout, arrangement of the systems to cool the entire room, etc.) and are not designed for the specific number of computing systems being employed in the data center.

The present teachings include cooling systems for cooling heat producing electronic equipment, such as computer hardware (rack servers and other similar hardware systems, for example), telecommunications equipment, power equipment (protection, conditioner, transformers), industrial automation equipment, etc., that are more efficient, more compact, and more portable as compared to current cooling systems. The cooling systems according to the present teachings provide numerous additional advantages as described herein, and as one skilled in the art will recognize.

SUMMARY

This section provides a general summary of the disclosure, and is not a comprehensive disclosure of its full scope or all of its features.

The present teachings include a cooling system for electronic equipment having an evaporator, a rack to which the electronic equipment can be mounted above the evaporator, and a condenser spaced apart from the evaporator. Air warmed by the electronic equipment is directed to the evaporator, cooled at the evaporator, and directed back to the electronic equipment to cool the electronic equipment.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of select embodiments and not all possible implementations, and are not intended to limit the scope of the present disclosure.

FIG. 6 is a front perspective view of a condenser unit in accordance with the present teachings;

FIG. 7 illustrates the cooling system according to the present teachings configured to cool electronic components mounted to an open rack.

Corresponding reference numerals indicate corresponding parts throughout the several views of the drawings.

DETAILED DESCRIPTION

Example embodiments will now be described more fully with reference to the accompanying drawings.

Figure 1:
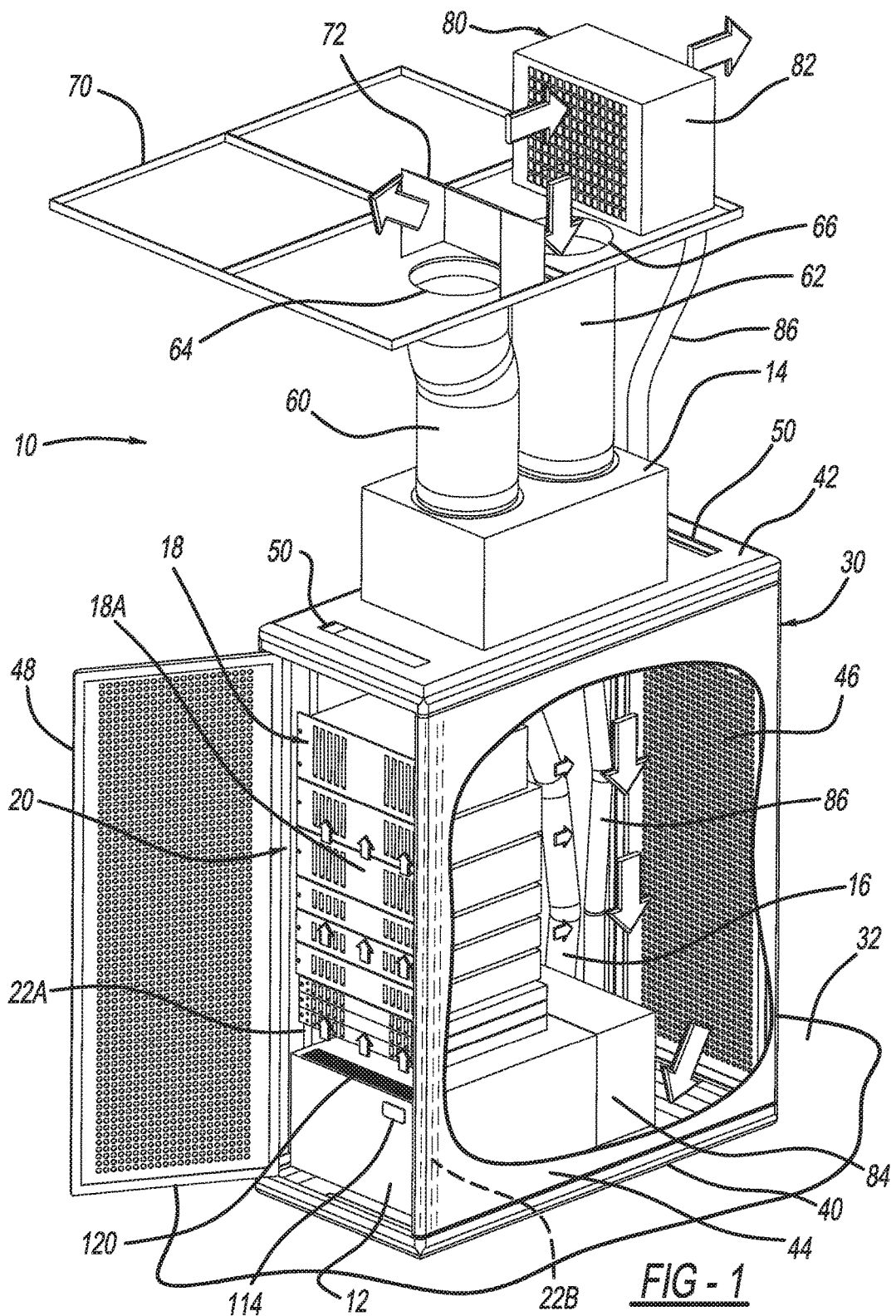
FIG. 1 is a perspective view of a cooling system according to the present teachings configured to cool electronic components mounted to a rack and enclosed within a cabinet.

With initial reference to FIG. 1, a cooling system according to the present teachings is generally illustrated at reference numeral 10. The cooling system 10 generally includes an evaporator unit 12 and a condenser unit 14. A conduit 16 including refrigerant lines, as explained further herein, connects the evaporator unit 12 and the condenser unit 14. The cooling system 10 is configured to cool any suitable type of electronic equipment 18, such as any suitable computing hardware including rack servers as illustrated in the exemplary drawings. The electronic equipment 18 can be mounted to a rack 20, such as a server rack, as explained herein.

In the example of FIG. 1, the electronic equipment 18, the rack 20, and the evaporator unit 12 are housed within a cabinet 30 seated on a floor 32. The cabinet 30 generally includes a base 40, a top 42, a pair of sidewalls 44, a rear door 46, and a front door 48. The base 40 can be an open or closed base, and is typically seated on floor 32 of a server room, or any other suitable room. The top 42 of the cabinet 30 can include one or more openings 50 through which power cables and information technology cables can be routed to the electronic equipment 18. One or more of the sidewalls 44, the rear door 46, and the front door 48 may include cooling vents.

The server rack 20 includes a plurality of posts, such as posts 22A and 22B, to which the electronic equipment 18 is mounted. The electronic equipment 18 can be mounted above the evaporator unit 12, which advantageously reduces the possibility that any liquid leaked from the evaporator unit 12 will reach the electronic equipment 18. The evaporator unit 12 may be mounted to the rack 20 at a position on the rack 20 below the electronic equipment 18. The evaporator unit 12 may also be mounted to a rack separate from the rack 20, mounted to the base 40, or arranged in any other suitable manner. For example, in some applications the evaporator unit 12 may be mounted above the electronic equipment 18. In other applications the evaporator unit 12 may be mounted to an intermediate position on the rack 20 such that electronic equipment 18 is both above and below the evaporator unit 12.

The evaporator unit 12 is advantageously positioned beneath the electronic equipment 18 and directly adjacent thereto so that cool air flowing from the evaporator unit 12 has a short distance to travel to reach the electronic equipment 18, and particularly a front end 18A of the electronic equipment 18, where the cooled air can be drawn into and through the electronic equipment 18 by fans (see FIGS. 3 and 5 at 122) or any other suitable air circulation device. An upper outlet 120 of the evaporator unit 12 is advantageously arranged just beneath the front ends 18A of the electronic equipment 18 so that cool air blowing through the upper outlet 120 has a short distance to travel in order to reach the front ends 18A of the electronic equipment 18. The upper outlet 120 can slightly protrude out beyond the front ends 18A, and in some instances beyond front posts 22A and 22B as illustrated in FIG. 7 for example, to facilitate airflow to the front ends 18A.

Extending from the condenser unit 14 is an outlet tube 60 and an inlet tube 62. In the example illustrated, the outlet tube 60 extends to an outlet aperture 64 defined in ceiling 70, and the inlet tube 62 extends to an inlet aperture 66 defined in the ceiling 70. A deflector 72 can be arranged over the outlet aperture 64 as illustrated to direct airflow exiting the condenser unit 14 away from airflow entering the condenser unit 14. Although the example of FIG. 1 illustrates the outlet and inlet tubes 60 and 62 extending to the ceiling 70, the outlet and inlet tubes 60 and 62 can extend to any other suitable location. For example, the outlet and inlet tubes 60 and 62 can extend to a wall, ventilation manifold, roof, etc.

The cooling system 10 may optionally include a thermosiphon system 80. The thermosiphon system 80 generally includes a thermosiphon condenser unit 82 and a thermosiphon evaporator unit 84, which are connected by a thermosiphon conduit 86. In the example illustrated the thermosiphon condenser unit 82 is arranged above the ceiling 70 proximate to the inlet aperture 66. However, the thermosiphon condenser unit 82 can be arranged at any suitable position, such as where relatively cool airflow can pass through the thermosiphon condenser unit 82 in order to cool coolant flowing therethrough, which has been warmed by heat generated by the electronic equipment 18, as explained in detail herein. The thermosiphon condenser unit 82 can be positioned in any environment that is cooler than the rack 20 and elevated above the thermosiphon evaporator unit 84, such as above the ceiling 70, in an adjacent room, in an adjacent building, etc. Although the thermosiphon evaporator unit 84 is illustrated in FIG. 1 as adjacent to the evaporator unit 12, the thermosiphon evaporator unit 84 can be arranged at any other suitable position to cool air that has been warmed by the electronic equipment 18 as explained herein.

Figure 2:
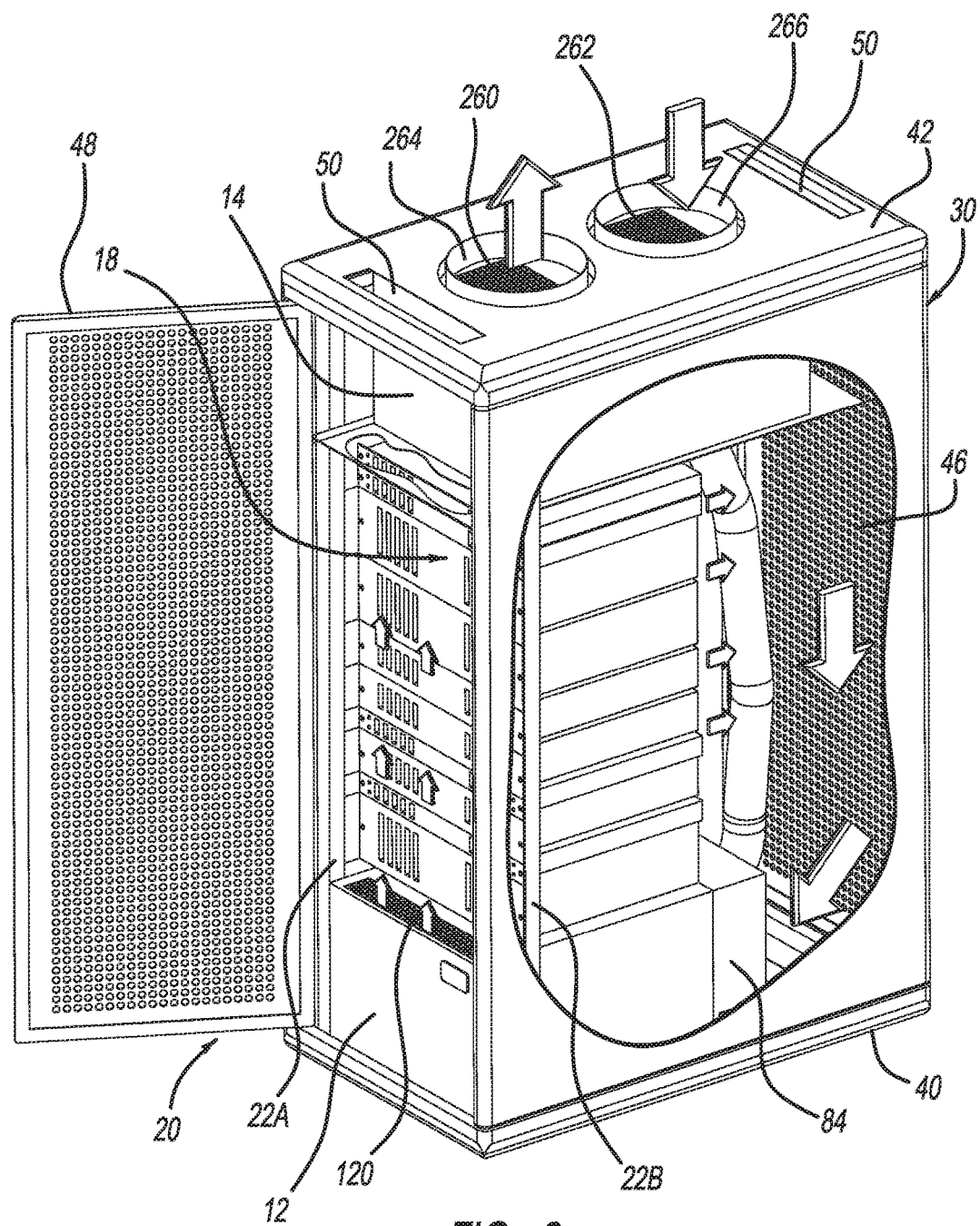
FIG. 2 is a perspective view of a cooling system according to the present teachings with a condenser unit arranged inside the cabinet, instead of on top of the cabinet as illustrated in FIG. 1.

With reference to FIG. 2, the condenser unit 14 can be arranged within the cabinet 30, such as above the electronic equipment 18, which can advantageously reduce the height of the cooling system 10 and make the cooling system 10 portable. The condenser unit 14 can be mounted to the rack 20, or to any other suitable mounting rack or device. The condenser unit 14 can also be mounted at any other suitable location, such as to the ceiling 70, a building roof, a building wall, seated on the floor 32 at another location within the room, arranged in another room, etc. The evaporator unit 12 and the condenser unit 14 may be arranged so that they overlap, which can advantageously reduce the size of the cooling system 10.

With continued reference to FIGS. 1 and 2, and additional reference to FIG. 3, additional features of the cooling system 10 will now be described, as well as operation of the cooling system 10. The evaporator unit 12 includes an evaporator 110, a blower 112, a control module 114, a return air inlet 116, and the upper outlet 120 (cold air supply). The condenser unit 14 includes a compressor 130, condenser 132, and a blower 134.

Extending between the condenser 132 and the evaporator 110 is a first refrigerant conduit or tube 140. Extending between the evaporator 110 and the compressor 130 is a second conduit or tube 142. The compressor 130 and the condenser 132 are also connected by a suitable refrigerant conduit or tube. Arranged along the first tube 140 between the condenser 132 and the evaporator 110 is any suitable thermal expansion device 144, such as a thermal expansion valve (TXV), electronic expansion valve (EXV), orifice tube, or capillary tube.

During operation of the cooling system 10, refrigerant is pumped by the compressor 130. Refrigerant enters the thermal expansion device 144 as a relatively warm high pressure liquid. At the thermal expansion device 144, the high pressure liquid expands, which reduces the pressure of the refrigerant. The now low pressure liquid refrigerant passes through the first tube 140 to the evaporator 110. As the low pressure liquid refrigerant flows through the evaporator 110, the refrigerant absorbs heat of airflow warmed by the electronic equipment 18, which is drawn into the return air inlet 116 and across the evaporator 110 by the blower 112. The evaporator 110 can have a generally linear shape, or any other suitable shape, such as a V-shape or U-shape to increase the surface area thereof, and the capacity of the evaporator 110 to absorb heat into the refrigerant.

The air cooled at the evaporator 110 is blown out from within the evaporator unit 12 through the upper outlet 120 by the blower 112 to the front 18A of the electronic equipment 18 in order to cool the electronic equipment 18. As described further herein, the blower 112 may also blow cooled air out through side outlets 180 and 182 (see FIGS. 5A and 5B for example) of the evaporator unit 12 in order to direct cooled air to adjacent racks of electronic equipment (see FIG. 8, for example, and the additional description provided herein).

The cooled air can be drawn through the electronic equipment 18 by fans 122 thereof in order to cool the electronic equipment 18. As air flows through the electronic equipment 18 and cools the electronic equipment 18, the air is warmed by the electronic equipment 18 and can be pushed out from within the electronic equipment 18 by the fans 122. The warmed air is then drawn back into the evaporator unit 12 and across the evaporator 110 by the blower 112 in order to again cool the air as the airflow cycle repeats. The fans 122 are optional and may not be included with all electronic equipment 18. The airflow of the evaporator unit 12 can force airflow through the electronic equipment 18 to provide passive cooling, thus making the fans 122 unnecessary and conserving energy.

As the refrigerant of the evaporator 110 absorbs heat, the refrigerant is converted to a low pressure gas, and flows from the evaporator 110 to the compressor 130 through the second tube 142. The compressor 130 compresses the low pressure gas, and thus pressurizes the low pressure gas refrigerant into a high pressure gas refrigerant. The high pressure gas refrigerant is pumped to the condenser 132 by the compressor 130. At the condenser 132, heat is radiated out of the refrigerant, and the refrigerant is converted back into a high pressure liquid prior to being pumped back to the thermal expansion device 144. The blower 134 draws air into the condenser unit 14 through the inlet tube 62, and across the condenser 132. The heat radiated from the condenser 132 is blown out from within the condenser unit 14 by the blower 134 through the outlet tube 60.

The cooling system 10 can advantageously include the thermosiphon system 80, which can advantageously cool airflow warmed by the electronic equipment 18 without operating the compressor 130, which saves energy. The thermosiphon system 80 is particularly useful in cooler environments. The thermosiphon system 80 includes a thermosiphon condenser 150 arranged within the thermosiphon condenser unit 82. To facilitate circulation of air across the thermosiphon condenser 150, the thermosiphon condenser unit 82 may include a fan 152. The thermosiphon conduit 86 extends from the thermosiphon condenser 150 to the thermosiphon evaporator unit 84, and specifically a thermosiphon evaporator 154 thereof. Extending through the thermosiphon conduit 86 is a first conduit or tube 160 and a second conduit or tube 162. The first and second tubes 160 and 162 can be any suitable tubes sufficient to carry any suitable coolant, such as water, refrigerant, etc., between the thermosiphon condenser 150 and the thermosiphon evaporator 154.

Figure 3:
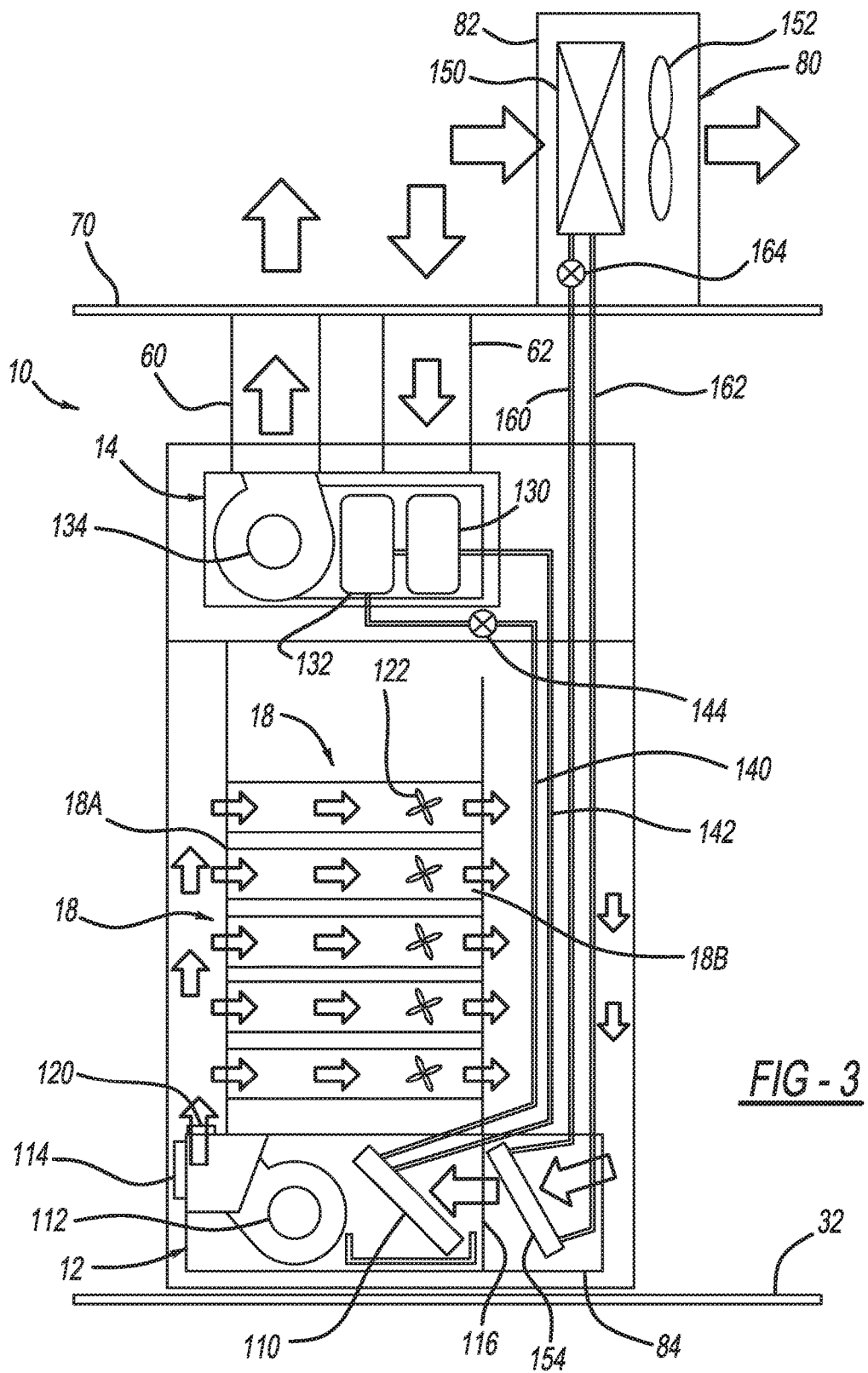
FIG. 3 is a side view of the cooling system of FIG. 1, but with the condenser inside the cabinet.
Figure 4:
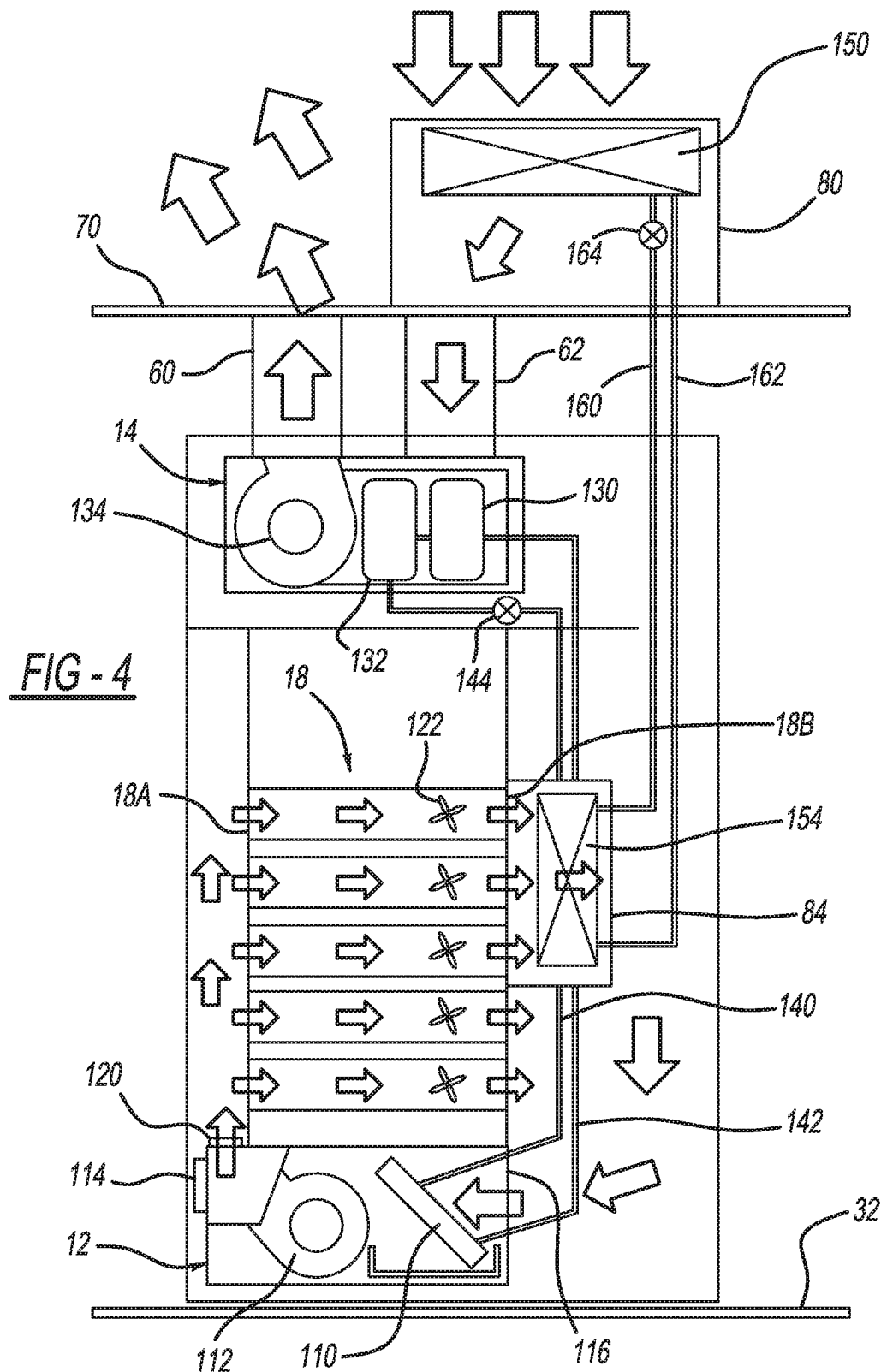
FIG. 4 is a side view of a cooling system that is similar to FIG. 3, but with a thermosiphon condenser arranged horizontally and without a fan (the thermosiphon condenser is arranged vertically and adjacent a fan in FIG. 3), and with a thermosiphon evaporator at airflow outlets of the electronic components (the thermosiphon evaporator is adjacent a primary evaporator in FIG. 3)

In the example of FIG. 3, the thermosiphon evaporator unit 84 and the thermosiphon evaporator 154 thereof are arranged adjacent to the evaporator unit 12 (and in some applications the evaporators 110 and 154 may be arranged such that they abut, or generally abut, one another). However, the thermosiphon evaporator unit 84 can be arranged at any other suitable position, such as at the rear 18B of the electronic equipment 18, as illustrated in FIG. 4 for example. Although the thermosiphon condenser 150 is illustrated as extending vertically in FIG. 3, the thermosiphon condenser 150 can be horizontally arranged as illustrated in FIG. 4. By arranging the thermosiphon condenser 150 horizontally and across the inlet tube 62 as illustrated in FIG. 4, the blower 134 will advantageously draw air across the thermosiphon condenser 150, which in many instances will make it possible to eliminate the fan 152 and conserve energy.

At the thermosiphon condenser 150, airflow passing across the condenser 150 will cool coolant passing through the condenser 150. The cooled coolant flows from the thermosiphon condenser 150 through the first tube 160 down to the thermosiphon evaporator 154. Gravity draws the coolant to the evaporator 154 from the condenser 150, thus advantageously eliminating the need for a compressor or other pump. At the thermosiphon evaporator 154, the cool coolant cools warm airflow passing across the thermosiphon evaporator 154, the warmed airflow having been warmed by the electronic equipment 18. The coolant is warmed by the warm airflow passing across the evaporator 154. As the coolant is warmed, the coolant becomes less dense and more buoyant, which causes the warmed coolant to rise up through the second tube 162 to the thermosiphon condenser 150, where the warmed coolant is cooled. After the coolant has cooled, the coolant flows back to the evaporator 154 to again cool airflow passing across the evaporator 154. The thermosiphon system 80 can include a shutoff valve 164, such as along the first tube 160, for stopping coolant flow when the thermosiphon system 80 is not in use. The thermosiphon system 80 can be used in conjunction with operation of the compressor 130, or in place of operation of the compressor 130, such as during cooler conditions.

Figures 5A, 5B:
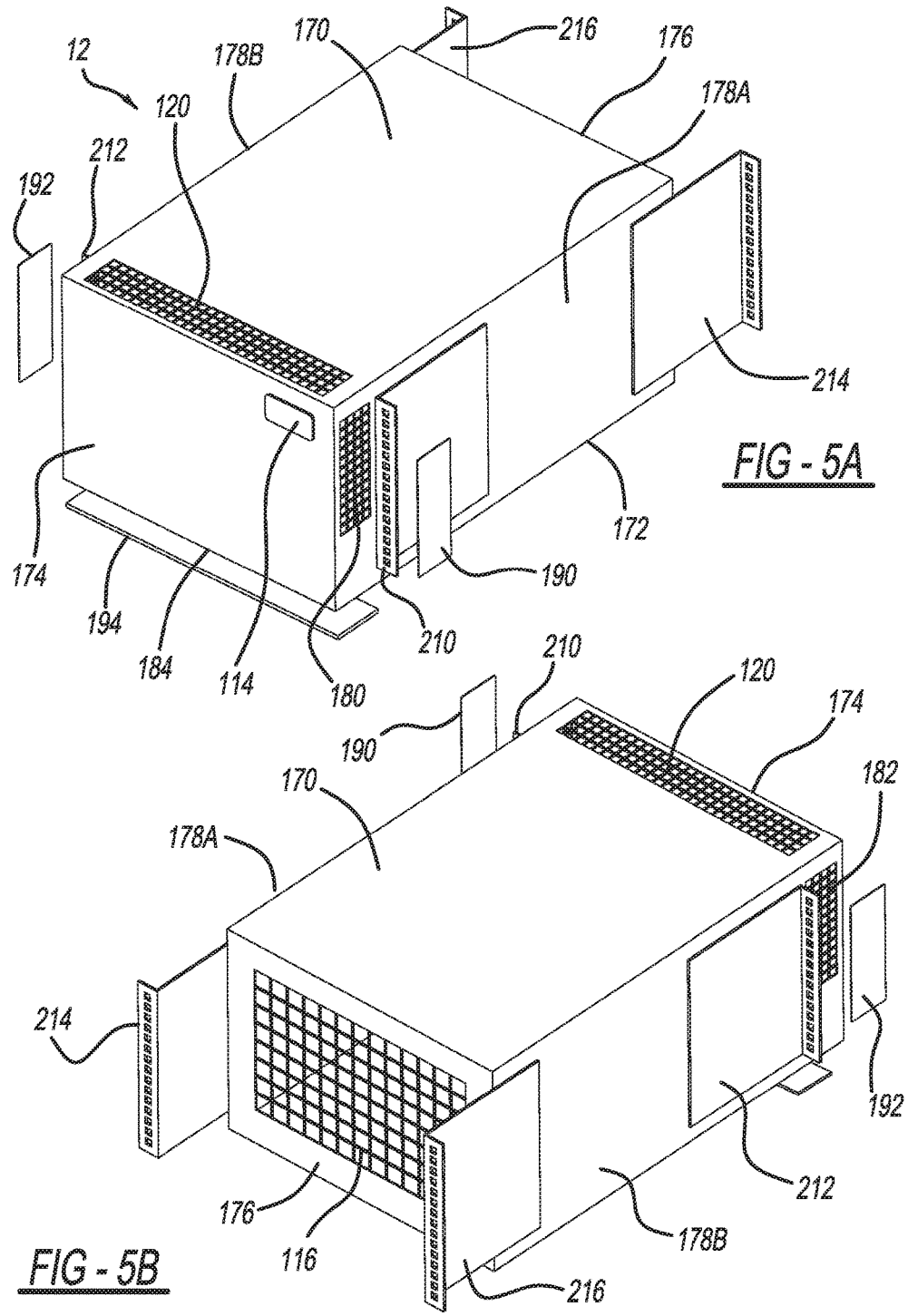
FIG. 5A is a front perspective view of an evaporator unit according to the present teachings.
FIG. 5B is a rear perspective view of the evaporator unit of FIG. 5B.
Figure 8:
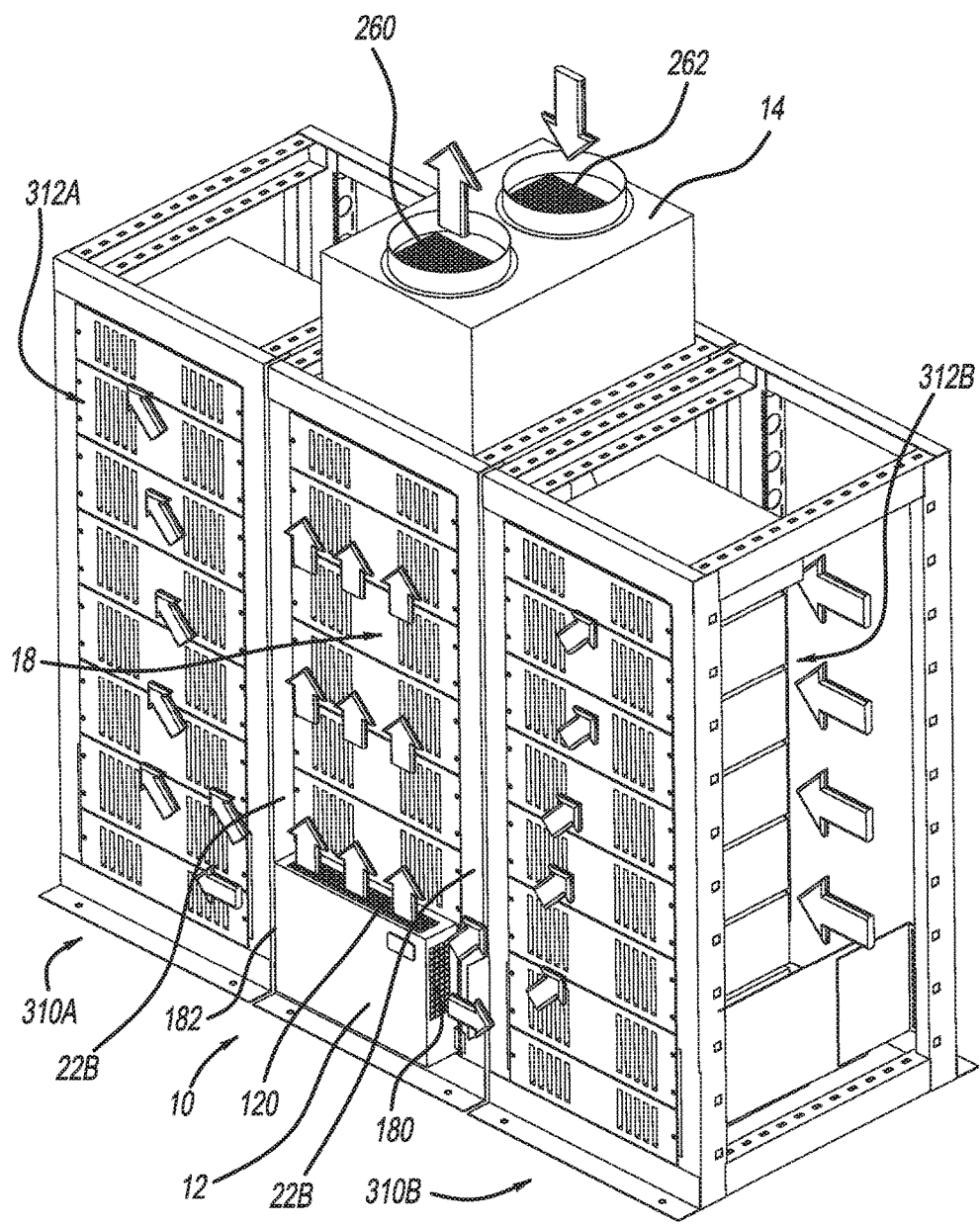
FIG. 8 illustrates the cooling system of FIG. 7 arranged between two adjacent racks to cool electronic components of the adjacent racks.

With additional reference to FIGS. 5A and 5B, the evaporator unit 12 will now be described in additional detail. The evaporator unit 12 includes a top 170, a bottom 172, a front end 174, and a rear end 176. The evaporator unit 12 further includes a first side 178A and a second side 178B. The upper outlet (cold air supply) 120 is at the top 170 proximate to the front end 174. A first side outlet 180 can be arranged at the first side 178A proximate to the front end 174, and a second side outlet 182 can be arranged at the second side 178B proximate to the front end 174. As illustrated in FIG. 8, the first and second side outlets 180 and 182 can advantageously be used to direct cooled airflow to first and second adjacent server racks 310A and 310B in order to cool electronic equipment 312A and 312B thereof. A lower outlet (cold supply outlet) can be arranged at the bottom 172 proximate to the front end 174. The lower outlet 184 can be used in applications where electronic equipment to be cooled is arranged below the evaporator unit 12. The first side outlet 180, the second side outlet 182, and the lower outlet 184 can be selectively covered by covers 190, 192, and 194 respectively when not in use. The return air inlet 116 is arranged at the rear end 176 as illustrated, but may be arranged at any other suitable position, such as on the top 170 and/or the sides 178A/178B.

The control module 114 can be arranged at any suitable position about the evaporator unit 12, or remote to the evaporator unit 12. The control module 114 is configured to control operation of the evaporator unit 12, the condenser unit 14, and/or the compressor 130, such as to control the temperature of the cooling system 10. The control module 114 can further control opening and closing of the shutoff valve 164 to control activation of the thermosiphon system 80. Further, the control module 114 may provide status information to an end user, including whether the unit rack mount cooling system is on or off, the temperature settings for the cooling system, or any other similar information. In this application, the term "module" may be replaced with the term "circuit." The term "module" may refer to, be part of, or include processor hardware (shared, dedicated, or group) that executes code and memory hardware (shared, dedicated, or group) that stores code executed by the processor hardware. The code is configured to provide the features of the control module 114.

The evaporator unit 12 can be mounted using any suitable mounting hardware, such as brackets or mounts 210, 212, 214, and 216. The brackets 210 and 212 are arranged at first and second sides 178A and 178B respectively, and towards the front end 174. The brackets 214 and 216 are arranged at the sides 178A and 178B respectively, and generally towards the rear end 176. One or more of the mounts 210, 212, 214, and 216 can be used to mount the evaporator unit 12 to the rack 20, any other suitable rack, to the base 40 of the cabinet 30, or in any other suitable manner below the electronic equipment 18.

With reference to FIG. 6, the condenser unit 14 includes a top 250, a bottom 252, a front 254, a rear 256, and first and second sides 258A and 258B. At the top 250 is an air outlet 260, to which the outlet tube 60 is connected, and through which the blower 134 blows air out from within the condenser unit 14. Also at the top 250 is an air inlet 262, through which the blower 134 draws air into the condenser unit 14. The inlet tube 62 is arranged against the air inlet 262. To facilitate arrangement of the outlet tube 60 at the air outlet 260, an air outlet flange 264 can be arranged over the air outlet 260. Similarly air inlet flanges 266 can be arrange over the air inlet 262 to facilitate arrangement of the inlet tube 62 over the air inlet 262. Two air inlet flanges 266 are illustrated and can be used when two inlet tubes 62 are provided. When only a single inlet tube 62 is used, only a single air inlet flange 266 is used (see FIGS. 1, 2, and 8). Although the outlet 260 and the inlets 262 are illustrated as arranged on the top 250, they may be arranged at any other suitable position, such as on the sides 258A/258B, at the front 254, or at the rear 256.

The condenser unit 14 includes any suitable mounting hardware, such as brackets or mounts 270, 272, 274, and 276. The brackets 270 and 272 are at the first and second sides 258A and 258B respectively, and proximate to the front 254. Brackets 274 and 276 are at the first and second sides 258A and 258B respectively, proximate to the rear 256. The brackets 270, 272, 274, and 276 can be used to mount the condenser unit 14 to the rack 20 above the electronic equipment 18, or to any other suitable mounting hardware. One or more of the brackets 270, 272, 274, and 276 can be rearranged, such as moved to the bottom 252, in order to facilitate mounting the condenser unit 14 to the top 42 of the cabinet 30, as illustrated in FIG. 1, for example. With reference to FIG. 2, the brackets 270, 272, 274, and 276 can be used to mount the condenser unit within the cabinet 30. The brackets 270, 272, 274, and 276 can also be used to mount the condenser unit to an open rack installation, such as inside the open rack or on top of the open rack, as illustrated in FIG. 7.

FIG. 7 illustrates an open rack installation including a plurality of posts, such as first post 22A, second post 22B, third post 22C, and a fourth post that is not visible. The installation of FIG. 7 includes a base 24 and a top 26. As illustrated in FIG. 7, the electronic equipment 18 can be mounted directly to at least the front first and second posts 22A and 22B. The evaporator unit 12 can be mounted directly to the front first and second posts 22A and 22B with the brackets 210 and 212. The evaporator unit 12 may also be mounted to the third post 22C and the fourth post with brackets 214 and 216. Although the condenser unit 14 is illustrated as mounted on the top 26, the condenser unit 14 can be mounted beneath the top 26 in any suitable manner, such as to the posts 22A, 22B, 22C (and the hidden fourth post) with one or more of the brackets 270, 272, 274, and 276.

FIG. 8 illustrates the cooling system 10 in an open rack installation between a first adjacent server rack 310A and a second adjacent server rack 310B including electronic equipment 312A and 312B respectively. The first and second side outlets 180 and 182 are uncovered, which allows cooled airflow to exit therefrom and cool the electronic equipment 312A and 312B. Warm airflow exiting the electronic equipment 312A and 312B at the rear ends thereof is drawn into the evaporator unit 12 by the blower 112, for cooling by the evaporator unit 12 (and or the thermosiphon evaporator 154) and recirculated to the electronic equipment 312A and 312B. Although the condenser unit 14 is illustrated as mounted to the top of the open rack installation, the condenser unit 14 may be mounted beneath the top to one or more of the posts 22A, 22B, 22C, and the fourth hidden post, or in any other suitable manner. The condenser unit 14 may also be arranged remote to the open rack installation, as explained above. Although FIG. 8 illustrates open rack installations, cabinet installations may also be used with sidewalls removed. For example, the cooling system 10 can be arranged within the cabinet 30 and the sidewalls 44 thereof can be removed to allow airflow to travel to the first and second adjacent server racks 310A and 310B. The first and second adjacent server racks 310A and 310B can be housed within cabinets similar to the cabinet 30, but with at least the sidewalls abutting the cooling system 10 removed.

The present teachings thus advantageously provide for a cooling system 10 with increased cooling efficiency, simplicity, and portability. The cooling system 10 also advantageously requires less floor space as compared to existing cooling systems. Because the evaporator unit 12 is connected to the rack 20, or adjacent thereto, the distance that cold air blown from the evaporator unit 12 must travel to reach the electronic equipment 18 and return to the evaporator unit 12 from the electronic equipment 18, is greatly reduced as compared to current cooling systems, which increases efficiency and enhances the ability of the cooling system 10 to cool the electronic equipment 18. By reducing the distance that the air travels to and from the evaporator unit 12, there is less of a chance that warmer air outside of the rack 20 will mix with the cool air exiting the evaporator unit 12, which reduces the cooling efficiency of the cooling system 10. The cooling system 10 is also more efficient as compared to existing systems because the evaporator unit 12 only directs cooled air to the front ends 18A of the electronic equipment 18, which is where the electronic equipment 18 typically draws air in. Existing systems often disperse cooled air about an entire server room, which is greatly inefficient.

The present teachings provide numerous additional advantages, particularly advantages associated with separating the evaporator unit 12 and the condenser unit 14. For example, the evaporator unit 12 can be arranged so that it is not above the electronic equipment 18, which protects against any possibility of water leaking on the electronic equipment 18. Also, separating the evaporator and condenser units 12 and 14 overcomes various issues that arise from arranging both the evaporator and condenser units 12 and 14 at the bottom of the rack 20. When the evaporator and condenser units 12 and 14 are arranged together at the bottom of the rack 20, as is the case in some packaged AC systems, a standard rear door 46 that is perforated or solid cannot be used. Instead, the rear door 46 must be modified and customized to accommodate ducting leading away from the cabinet 30, such as by shortening the rear door 46, which can increase costs. Such ducting can inhibit access to components within the cabinet 30 and undesirably increase the expense of the assembly. The present teachings advantageously eliminate the need for such ducting, which advantageously simplifies assembly and installation, and reduces the cost of the cooling system 10.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A cooling system for electronic equipment comprising:
an evaporator;
a rack to which the electronic equipment can be mounted above the evaporator; and
a condenser spaced apart from the evaporator;
wherein air warmed by the electronic equipment is directed to the evaporator, cooled by the evaporator, and directed back to the electronic equipment to cool the electronic equipment;
a primary condenser unit including the condenser and a compressor wherein:
the condenser is a primary condenser and the evaporator is a primary evaporator;
the cooling system further comprises a thermosiphon system that circulates coolant between a thermosiphon condenser and a thermosiphon evaporator;
at the thermosiphon evaporator the coolant absorbs heat generated by the electronic equipment, and at the thermosiphon condenser heat is radiated from the coolant; and
the thermosiphon evaporator is adjacent to the primary evaporator.

2. The cooling system of claim 1, further comprising an evaporator unit including the evaporator and a blower;
wherein the blower draws air warmed by the electronic equipment to the evaporator where the warmed air is cooled, and blows the cooled air to the electronic equipment to cool the electronic equipment.

3. The cooling system of claim 2, wherein:
the evaporator unit includes an outlet positioned to direct cooled air exiting the evaporator unit to front surfaces of the electronic equipment; and
the evaporator unit includes a return air inlet positioned to receive air into the evaporator unit that has been warmed by the electronic equipment.

4. The cooling system of claim 3, wherein the evaporator unit further includes at least one side outlet arranged to direct cooled air exiting the evaporator unit to electronic equipment mounted to one or more secondary racks on either side of the evaporator unit.

5. The cooling system of claim 1, wherein each one of the evaporator, the rack, and the condenser are housed within a cabinet having a door.

6. The cooling system of claim 1, wherein the rack is an open rack and the evaporator is housed in an evaporator unit mounted to the rack below the electronic equipment.

7. The cooling system of claim 1, wherein the condenser is housed in a condenser unit mounted to the rack above the electronic equipment such that the electronic equipment is between the condenser unit and the evaporator unit.

8. The cooling system of claim 1, wherein the condenser is housed in a condenser unit mounted to a top of a cabinet having a door; and
wherein the evaporator and the condenser are housed within the cabinet.

9. The cooling system of claim 1, wherein the thermosiphon evaporator is spaced apart from the primary evaporator and arranged at an airflow outlet of the electronic equipment.

10. The cooling system of claim 1, wherein the thermosiphon condenser is configured to be arranged above the thermosiphon evaporator.

11. A cooling system for electronic equipment comprising:
an evaporator;
a rack to which the electronic equipment can be mounted above the evaporator; and
a condenser spaced apart from the evaporator;
wherein air warmed by the electronic equipment is directed to the evaporator, cooled by the evaporator, and directed back to the electronic equipment to cool the electronic equipment;
a primary condenser unit including the condenser and a compressor wherein:
the condenser is a primary condenser and the evaporator is a primary evaporator;
the cooling system further comprises a thermosiphon system that circulates coolant between a thermosiphon condenser and a thermosiphon evaporator;
at the thermosiphon evaporator the coolant absorbs heat generated by the electronic equipment, and at the thermosiphon condenser heat is radiated from the coolant; and
the thermosiphon condenser is arranged such that air entering the primary condenser unit first flows through the thermosiphon condenser.

12. The cooling system of claim 11, wherein the thermosiphon evaporator is arranged at an airflow outlet of the electronic equipment.

13. A cooling system for electronic equipment comprising:
a rack to which the electronic equipment can be mounted;
an evaporator unit including an evaporator and a blower, the evaporator unit mounted to the rack below the electronic equipment with mounting hardware; and
a condenser unit mounted above the electronic equipment such that the electronic equipment is between the condenser unit and the evaporator unit, the condenser unit including a condenser, a compressor, and a blower;
wherein air warmed by the electronic equipment is drawn into the evaporator unit by the blower, cooled by the evaporator, and blown back to the electronic equipment to cool the electronic equipment;
a thermosiphon system including a thermosiphon evaporator and a thermosiphon condenser, the thermosiphon condenser is configured to be arranged above the thermosiphon evaporator;
wherein at the thermosiphon evaporator coolant absorbs heat generated by the electronic equipment, and at the thermosiphon condenser heat is radiated from the coolant; and
the thermosiphon evaporator is adjacent to the evaporator of the evaporator unit.

\* \* \* \* \*